US011239136B1

(12) United States Patent
Chen et al.

(10) Patent No.: US 11,239,136 B1
(45) Date of Patent: Feb. 1, 2022

(54) ADHESIVE AND THERMAL INTERFACE MATERIAL ON A PLURALITY OF DIES COVERED BY A LID

(71) Applicant: Taiwan Semiconductor Manufacturing Co., Ltd., Hsinchu (TW)

(72) Inventors: Chih-Hao Chen, Taipei (TW); Chin-Fu Kao, Taipei (TW); Li-Hui Cheng, New Taipei (TW); Szu-Wei Lu, Hsinchu (TW); Chih-Chien Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/941,509

(22) Filed: Jul. 28, 2020

(51) Int. Cl.
*H01L 23/34* (2006.01)
*H01L 23/48* (2006.01)
*H01L 23/28* (2006.01)
*H01L 21/00* (2006.01)
*H05K 7/20* (2006.01)
*H01L 23/42* (2006.01)
*H01L 27/06* (2006.01)
*H01L 23/31* (2006.01)
*H01L 23/00* (2006.01)
*H01L 21/56* (2006.01)
*H01L 23/538* (2006.01)
(Continued)

(52) U.S. Cl.
CPC .......... *H01L 23/42* (2013.01); *H01L 21/565* (2013.01); *H01L 23/3128* (2013.01); *H01L 23/3157* (2013.01); *H01L 23/3185* (2013.01); *H01L 23/49816* (2013.01); *H01L 23/5386* (2013.01); *H01L 24/14* (2013.01); *H01L 24/17* (2013.01); *H01L 24/27* (2013.01); *H01L 24/29* (2013.01); *H01L 25/0655* (2013.01); *H01L 27/0688* (2013.01); *H01L 2224/2958* (2013.01)

(58) Field of Classification Search
CPC ........... H01L 23/49816; H01L 25/0655; H01L 25/0652; H01L 21/565; H01L 24/27; H01L 24/28; H01L 23/42; H01L 23/3185; H01L 23/3128; H01L 27/0688; H01L 23/5386; H01L 23/3157; H01L 24/17; H01L 24/14; H01L 21/563
See application file for complete search history.

(56) References Cited

U.S. PATENT DOCUMENTS 7,678,615 B2 * 3/2010 Touzelbaev ............ H01L 23/42
438/122
8,993,380 B2 3/2015 Hou et al.
(Continued)

FOREIGN PATENT DOCUMENTS

TW 201913920 4/2019

*Primary Examiner* — Alonzo Chambliss
(74) *Attorney, Agent, or Firm* — JCIPRNET

(57) ABSTRACT

Provided are a package structure and a method of forming the same. The package structure includes a first die, a second die, an interposer, an underfill layer, a thermal interface material (TIM), and an adhesive pattern. The first die and the second die are disposed side by side on the interposer. The underfill layer is disposed between the first die and the second die. The TIM is disposed on the first die, the second die, and the underfill layer. The adhesive pattern is disposed between the underfill layer and the TIM to separate the underfill layer from the TIM.

20 Claims, 13 Drawing Sheets

(51) Int. Cl.
    *H01L 25/065*     (2006.01)
    *H01L 23/498*     (2006.01)

(56) References Cited

U.S. PATENT DOCUMENTS

| | | | |
|---|---|---|---|
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 10,756,058 | B2* | 8/2020 | Shih .................. H01L 23/49838 |
| 10,770,405 | B2* | 9/2020 | Huang .................. H01L 21/565 |
| 2007/0117270 | A1* | 5/2007 | Renavikar ............... H01L 23/42 <br> 438/122 |
| 2009/0057884 | A1* | 3/2009 | Too .................... H01L 25/0655 <br> 257/723 |
| 2010/0117222 | A1* | 5/2010 | Too .................... H01L 23/3736 <br> 257/704 |
| 2010/0327431 | A1* | 12/2010 | Touzelbaev ............ H01L 21/50 <br> 257/712 |
| 2012/0286404 | A1* | 11/2012 | Pagaila ............... H01L 23/3107 <br> 257/659 |
| 2017/0263518 | A1 | 9/2017 | Yu et al. |
| 2018/0350755 | A1* | 12/2018 | Huang ................ H01L 23/3736 |
| 2020/0219786 | A1 | 7/2020 | Hung et al. |
| 2020/0411395 | A1* | 12/2020 | Bozorg-Grayeli ...... H01L 23/10 |
| 2021/0104484 | A1* | 4/2021 | Jha .................... H01L 23/3128 |

\* cited by examiner

ADHESIVE AND THERMAL INTERFACE MATERIAL ON A PLURALITY OF DIES COVERED BY A LID

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Heat dissipation is a challenge in the 3DICs.

In a typical 3DIC, a heat spreader is adhered to the semiconductor dies to dissipate the heat generated from the semiconductor dies. However, there exist encapsulating materials such as underfill, molding compound, and the like, which have a poor adhesion with the heat spreader, thereby resulting in a delamination issue between the heat spreader and the encapsulating materials. As a result, there are quite a few challenges to be handled for the 3DIC technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
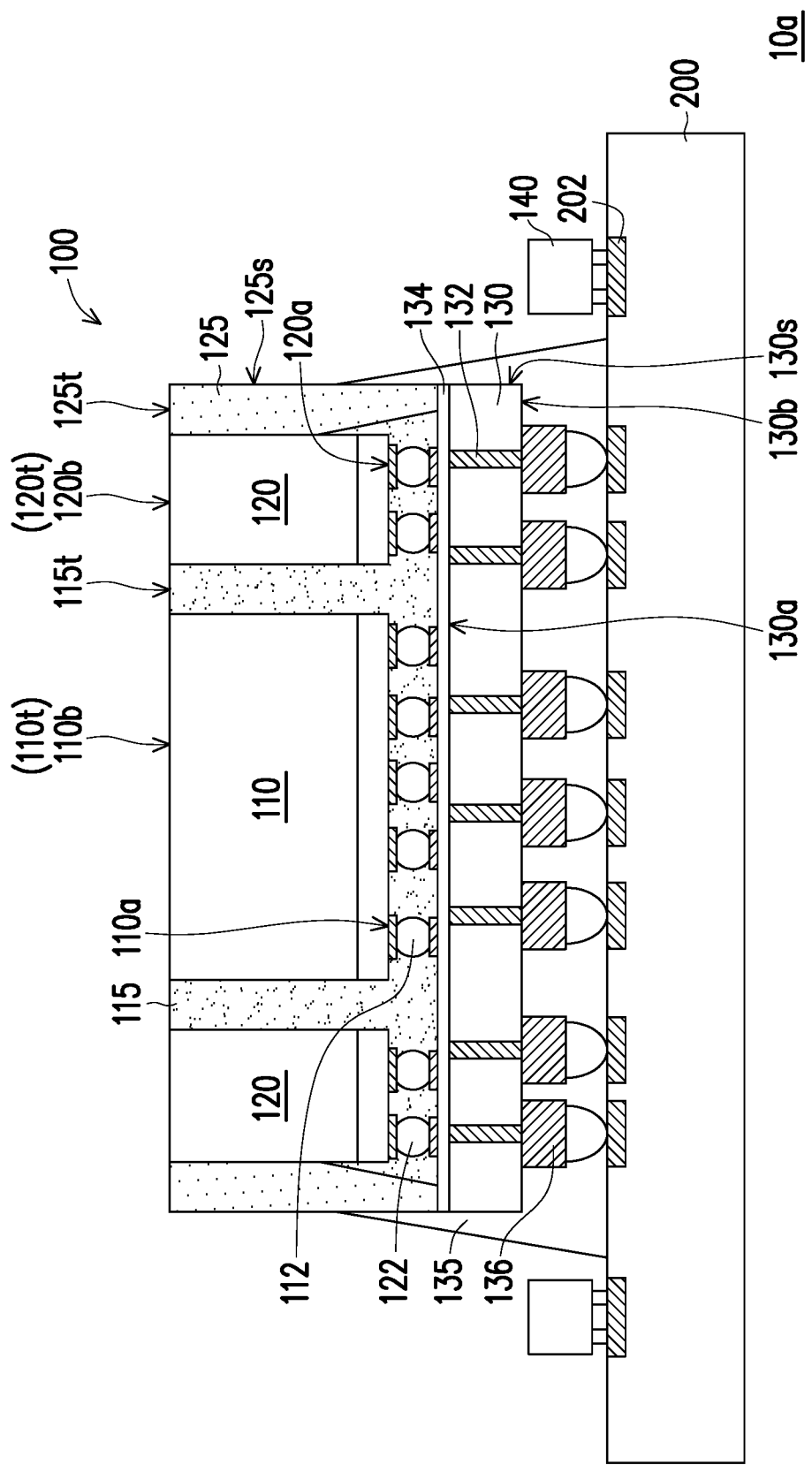
FIG. 1A to FIG. 1C are cross-sectional views of a method of forming a package structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments, a plurality of adhesive layers are dispensed selectively on an underfill layer between a first die and a plurality of second dies and on an encapsulant aside the first die and the second dies. A thermal interface material (TIM) is then formed on the first die, the second dies, and the adhesive layers, so that the adhesive layers are wrapped by the TIM. In the case, the adhesive layers separate the TIM from the underfill layer and the encapsulant, so as to improve an adhesion between the TIM and the underfill layer and the encapsulant, thereby decreasing the delamination issue and increasing the reliability.

Figure 1B:
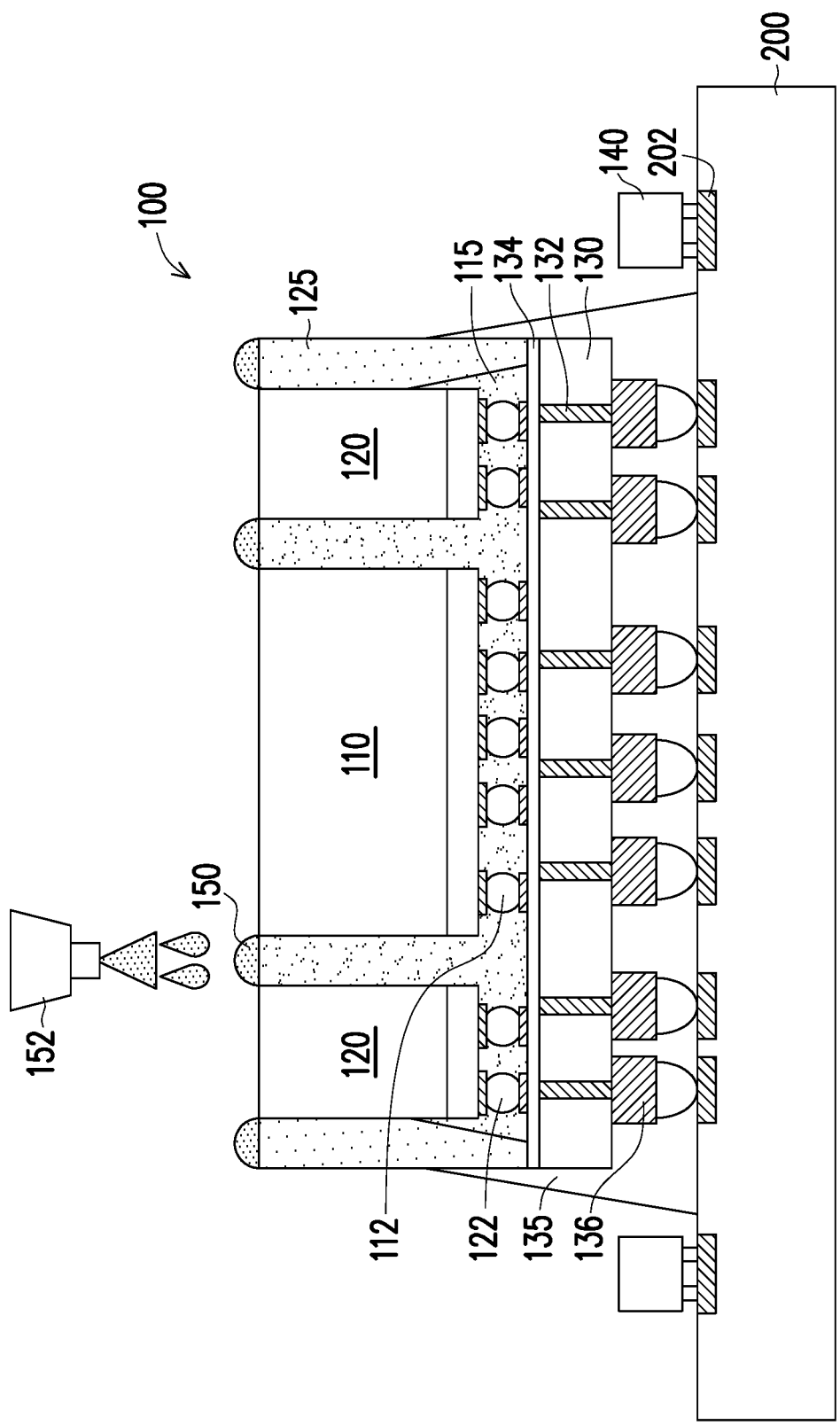
Figure 1C:
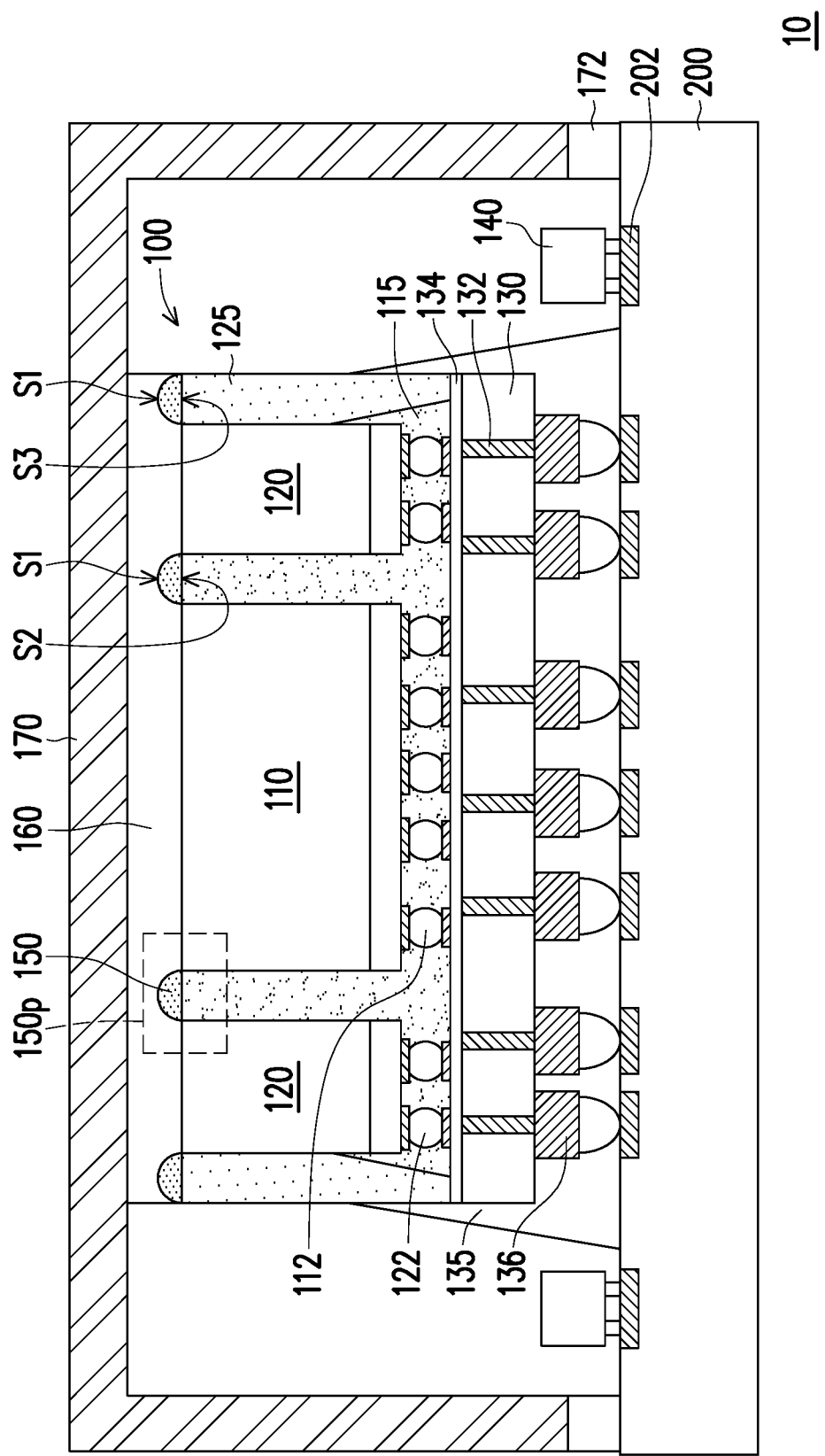
Figure 2:
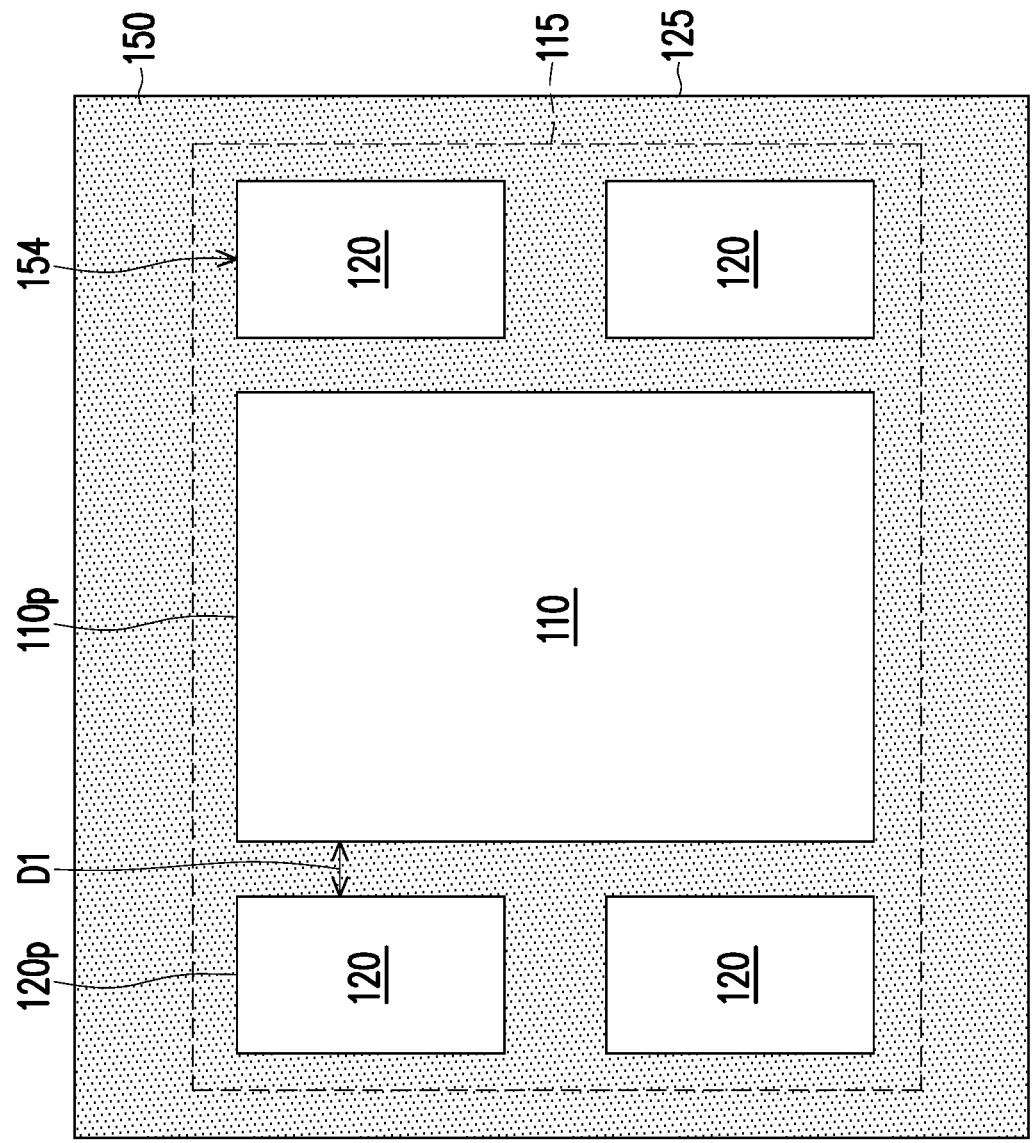
FIG. 2 is a top view of the package structure illustrated in FIG. 1C.

FIG. 1A to FIG. 1C are cross-sectional views of a method of forming a package structure in accordance with a first embodiment. FIG. 2 is a top view of the package structure illustrated in FIG. 1C.

Referring to FIG. 1A to FIG. 1C, a method of forming a package structure 10 (as shown in FIG. 1C) includes following steps. First, an initial structure 10a illustrated in FIG. 1A is provided. The initial structure 10a includes a package 100 bonded on a circuit substrate 200 to form a chip-on-wafer-on-substrate (CoWoS) package, although it should be appreciated that embodiments may be applied to other 3DIC packages.

In detail, the package 100 may include a first die 110, a second die group having a plurality of second dies 120, an underfill layer 115, a first encapsulant 125, and an interposer 130. Specifically, the first die 110 has a front-side 110a (i.e., an active surface) and a back-side 110b (i.e., a non-active surface) opposite to each other. Each second die 120 also has a front-side 120a (i.e., an active surface) and a back-side 120b (i.e., a non-active surface) opposite to each other. The first die 110 and the second dies 120 are flipped, so that the front-side 110a of the first die 110 and the front-sides 120a of the second dies 120 all face toward an upper surface 130a of the interposer 130. The first die 110 and the second dies 120 are bonded onto the upper surface 130a of the interposer 130 by a plurality of die connectors 112, 122, so as to form a chip-on-wafer (CoW) package, although it should be appreciated that embodiments may be applied to other 3DIC packages.

In some embodiments, the first die 110 and the second dies 120 each has a single function (e.g., a logic device, memory die, etc.), or may have multiple functions (e.g., a SoC). In a particular embodiment, the first die 110 is a processor and the second dies 120 are memory modules. In some alternative embodiments, the first die 110 is referred to as a die stack, which includes two bonded integrated circuit dies. The two integrated circuit dies are bonded such that the active surfaces are facing each other ("face-to-face") by hybrid bonding, fusion bonding, direct bonding, dielectric bonding, metal bonding, or the like. In other embodiments, the first die 110 is a processor, such as a central processing unit (CPU), graphics processing unit (GPU), application-specific integrated circuit (ASIC), or the like. In a specific embodiment, the first die 110 is a system-on-chip (SoC).

In some embodiments, the second dies 120 are memory devices, such as dynamic random access memory (DRAM) dies, static random access memory (SRAM) dies, hybrid memory cube (HMC) modules, high bandwidth memory (HBM) modules, or the like. In a specific embodiment, the second dies 120 is HBM modules.

As shown in FIG. 1A, in some embodiments, the die connectors 112, 122 is formed from a conductive material, such as solder, copper, aluminum, gold, nickel, silver, palladium, tin, the like, or a combination thereof. In a specific embodiment, the die connectors 112, 122 are micro bumps including a solder sandwiched between two metal layers. In addition, a redistribution layer (RDL) structure 134 is optionally disposed between the die connectors 112, 122 and the upper surface 130a of the interposer 130 to electrically connect the die connectors 112, 122 and through substrate vias (TSVs) 132 in the interposers 130. In some embodiments, the RDL structure 134 includes a plurality of polymer layers and a plurality of redistribution layers stacked alternately. The redistribution layers may be formed in the polymer layers to electrically connect the die connectors 112, 122 and the TSVs 132. The redistribution layers respectively include a plurality of vias and a plurality of traces connected to each other. In the case, a shown in FIG. 1A, the first die 110 and the second dies 120 may be electrically connected to the TSVs 132 in the interposer 130 by the die connectors 112, 122 and RDL structure 134.

As shown in FIG. 1A, the underfill layer 115 is disposed between the first die 110 and the second dies 120 and laterally encapsulates the die connectors 112, 122. In some embodiments, the underfill layer 115 is formed from any acceptable material, such as a polymer, epoxy, molding underfill, or the like. The underfill layer 115 may be formed by a capillary flow process after the first die 110 and the second dies 120 are attached or may be formed by a suitable deposition method before the first die 110 and the second dies 120 are attached.

The first encapsulant 125 is disposed to laterally encapsulate the underfill layer 115 and the second dies 120. In some embodiments, the first encapsulant 125 is formed from any acceptable material, such as a molding compound, epoxy, or the like. The first encapsulant 125 may be formed by compression molding, transfer molding, or the like. In some other embodiments, the first encapsulant 125 have fillers with average particle size greater than or equal to fillers of the underfill layer 115. The first encapsulant 125 may be formed over the interposer 130, such that the first die 110 and the second dies 120 are buried or covered. The first encapsulant 125 is then cured and planarized to expose the back-side 110b (top surface 110t) of the first die 110 and the back-sides 120b (top surfaces 120t) of the second dies 120 by a chemical mechanical polishing (CMP) process, a grinding process, or the like. After the planarization, as shown in FIG. 1A, a top surface 125t of the first encapsulant 125, the top surface 110t of the first die 110, the top surfaces 120t of the second dies 120, and a top surface 115t of the underfill layer 115 are substantially level or coplanar.

In some embodiments, the package 100 is formed by performing a singulation process on a wafer including a plurality of first and second dies 110 and 120, the underfill layer 115, and the first encapsulant 125 thereon. As a result of the singulation process, the wafer is singulated into a plurality of interposers 130, with each of the packages 100 having one interposer 130. In some embodiments, the singulation process includes a sawing process, a laser process, or a combination thereof. In the case, as shown in FIG. 1A, edges of the first encapsulant 125 and interposer 130 are coterminous, namely, a sidewall 125s of the first encapsulant 125 is substantially aligned with a sidewall 130s of the interposer 130.

After the singulation process, the CoW package 100 is bonded onto the circuit substrate 200 by a plurality of conductive connectors 136. In some embodiments, the conductive connectors 136 are disposed on a lower surface 130b of the interposer 130 to be electrically and/or physically connected to the circuit substrate 200. The conductive connectors 136 may be BGA connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 136 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

In some embodiments, the circuit substrate 200 is made of a semiconductor material, such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the circuit substrate 200 may be a SOI substrate. Generally, an SOI substrate includes a layer of a semiconductor material such as epitaxial silicon, germanium, silicon germanium, SOI, SGOI, or combinations thereof. The circuit substrate 200 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for circuit substrate 200.

The circuit substrate 200 may include active and passive devices (not shown), such as transistors, capacitors, resistors, combinations of these, and the like may be used to generate the structural and functional requirements of the design. The circuit substrate 200 may also include metallization layers and vias (not shown) and bond pads 202 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some other embodiments, the circuit substrate 200 is substantially free of active and passive devices.

In some embodiments, the conductive connectors 136 are attached onto the bond pads 202, thereby bonding the interposer 130 to the circuit substrate 200. The conductive connectors 136 are electrically and/or physically connected the circuit substrate 200 to the package 100. In some embodiments, a plurality of passive devices 140 (e.g., surface mount devices (SMDs)) is attached to the circuit substrate 200 (e.g., bonded to the bond pads 202). In such embodiment, the passive devices 140 are bonded to a same surface of the circuit substrate 200 as the conductive connectors 136. The conductive connectors 136 may have an epoxy flux (not shown) formed thereon before they are reflowed with at least some of the epoxy portion of the epoxy flux remaining after the package 100 is attached to the circuit substrate 200. This remaining epoxy portion may act as an underfill to reduce stress and protect the joints resulting from the reflowing the conductive connectors 136.

As shown in FIG. 1A, a second encapsulant 135 is formed to laterally encapsulate the conductive connectors 136, the interposer 130, a lower sidewall of the first encapsulant 125. In one embodiment, the second encapsulant 135 is formed from any suitable underfill material, such as a polymer, epoxy, molding underfill, or the like. The second encapsulant 135 may be formed by a capillary flow process after the package 100 is attached or may be formed by a suitable deposition method before the package 100 is attached.

Referring to FIG. 1B, an adhesive pattern 150 is selectively dispensed on the underfill layer 115 between the first die 110 and the second dies 120 and on the first encapsulant 125 by a dispenser 152. In some embodiments, the adhesive pattern 150 includes a polymer material, such as a liquid die attaching film (DAF), a polyimide (PI) based polymer, an epoxy based polymer, or the like. In some alternative embodiments, the adhesive pattern 150 is free of fillers.

Referring to FIG. 1B and FIG. 1C, a thermal interface material (TIM) 160 is dispensed on the first die 110, the second dies 120, and the adhesive pattern 150. A lid 170 is then attached to the package 100 and circuit substrate 200 to form the package structure 10. As shown in FIG. 1C, the lid 170 covers and surrounds the package 100 and the passive devices 140. In some embodiments, the lid 170 is formed from a material with high thermal conductivity (k), such as steel, stainless steel, copper, the like, or combinations thereof. In some alternative embodiments (discussed below), the lid 170 is coated with another metal, such as gold, nickel, or the like. In some other embodiments, the lid 170 is a single contiguous material. In another embodiment, the lid 170 includes multiple pieces that may be the same or different materials.

Specifically, the lid 170 is adhered to the package 100 by the TIM 160. The TIM 160 is sandwiched between the lid 170 and the first and second dies 110, 120, so as to thermally couple the lid 170 and the first and second dies 110, 120. In addition, the TIM 160 is formed to a thickness sufficiently large to bury the adhesive pattern 150. That is, as shown in FIG. 1C, the adhesive pattern 150 may be surrounded or wrapped by the TIM 160. In some embodiments, the adhesive pattern 150 is formed to a height of about 0.5 μm to 100 μm, such as about 10 μm. The TIM 160 may be formed to a thickness of from about 5 μm to about 300 μm, such as about 60 μm. The thickness of the TIM is greater than the height or thickness of the adhesive pattern 150. On the other hands, the lid 170 is adhered to the circuit substrate 200 by an adhesive 172. In some embodiments, the adhesive 172 is epoxy, glue, or the like. Alternatively, the adhesive 172 may be a thermally conductive material.

In some embodiments, the first die 110 and the second dies 120 may trap heat to become hot spots in the package structure 10. Therefore, the TIM 160 thermally couples the package 100 and lid 170 to dissipate the heat from the first and second dies 110, 120 to the lid 170. It should be noted that the adhesive pattern 150 may be disposed between the TIM 160 and the underfill layer 115 and/or the first encapsulant 125 to improve the adhesion between the TIM 160 and the underfill layer 115 and/or the first encapsulant 125, thereby decreasing the delamination issue and increasing the reliability. From the cross-sectional view of FIG. 1C, the adhesive pattern 150 may include a plurality of adhesive layers laterally spaced from each other. That is, the adhesive layers are discretely distributed on the underfill layer 115 between the first and second dies 110 and 120 and on the first encapsulant 125. The adhesive pattern 150 separates the TIM 160 and the underfill layer 115 and/or the first encapsulant 125, so that the TIM 160 is not in (physical) contact with the underfill layer 115 and/or the first encapsulant 125.

In some embodiments, the TIM 160 and the adhesive pattern 150 have different materials. The TIM 160 may have a thermal conductivity (k) greater than a thermal conductivity of the adhesive pattern 150. In the case, an area of the TIM 160 contacting the top surfaces 110t, 120t of the first and second dies 110, 120 may be referred to as a thermal path for dissipating the heat from the first and second dies 110, 120. In some embodiments, the TIM 160 is formed from a material with higher thermal conductivity (k), such as Ag, Cu, Sn, In, carbon nanotube (CNT), graphite, or the like. The adhesive pattern 150 may be formed from a material with lower thermal conductivity (k), such as a liquid die attaching film (DAF), a polyimide (PI) based polymer, an epoxy based polymer, or the like. In some embodiments, the thermal conductivity (k) of the TIM 160 is from about 0.5 $Wm^{-1}K^{-1}$ to about 200 $Wm^{-1}K^{-1}$, or from about 10 $Wm^{-1}K^{-1}$ to about 50 $Wm^{-1}K^{-1}$, such as about 10 $Wm^{-1}K^{-1}$. The thermal conductivity (k) of the adhesive pattern 150 may be from about 0.5 $Wm^{-1}K^{-1}$ to about 100 $Wm^{-1}K^{-1}$, or from about 0.5 $Wm^{-1}K^{-1}$ to about 10 $Wm^{-1}K^{-1}$, such as about 2 $Wm^{-1}K^{-1}$.

In some alternative embodiments, the TIM 160 is formed from another material, such as a polymer material, solder paste, indium solder paste, or the like. In some alternative embodiments, the thermal conductivity (k) of the TIM 160 is from about 0.5 $Wm^{-1}K^{-1}$ to about 200 $Wm^{-1}K^{-1}$, or from about 10 $Wm^{-1}K^{-1}$ to about 50 $Wm^{-1}K^{-1}$, such as about 10 $Wm^{-1}K^{-1}$.

In some embodiments, since the adhesive pattern 150 and the TIM 160 have different materials, a first interface S1 is included between the adhesive pattern 150 and the TIM 160. In some other embodiments, the TIM 160 has a plurality of fillers, while the adhesive pattern 150 is free of fillers. Accordingly, the fillers in the TIM 160 may surround an upper surface of the adhesive pattern 150 to form the first interface S1.

Similarly, the adhesive pattern 150 and the underfill layer 115 may have different materials, thus a second interface S2 is included between the adhesive pattern 150 and the underfill layer 115. In some other embodiments, the underfill layer 115 has a plurality of fillers, while the adhesive pattern 150 is free of fillers. Accordingly, the fillers in the underfill layer 115 may surround a lower surface of the adhesive pattern 150 to form the second interface S2. In addition, the adhesive pattern 150 and the first encapsulant 125 have different materials, thus a third interface S3 is included between the adhesive pattern 150 and the first encapsulant 125. In some other embodiments, the first encapsulant 125 has a plurality of fillers, while the adhesive pattern 150 is free of fillers.

Accordingly, the fillers in the first encapsulant 125 may surround a lower surface of the adhesive pattern 150 to form the third interface S3.

From a top view of FIG. 2, the package structure 10 includes the first die 110 and the second dies 120 disposed side by side. In the present embodiment, the first die 110 is the SoC and the second dies 120 are HBM modules. In detail, an area of the first die 110 may be greater than an area of one of the second dies 120. The number of the second dies 120 may be greater than the number of the first die 110. The second dies 120 are disposed at both sides of the first die 110. The first die 110 and the second dies 120 may be electrically connected to each other by the RDL structure 134, the interposer 130, and the circuit substrate 200, as shown in FIG. 1C. As show in the top view of FIG. 2, the adhesive pattern 150 has a plurality of openings 154 to expose the first and second dies 110 and 120. In other word, the adhesive pattern 150 is disposed on the underfill layer 115 and the first encapsulant 125, so as to surround a perimeter 110p of the first die 110 and perimeters 120p of the second dies 120 in the top view. In alternative embodiments, the adhesive pattern 150 includes two adhesive layers respectively disposed on the underfill layer 115 between the first and second dies 110 and 120. In other word, the two adhesive layers may be disposed along both sides (e.g., right and left sides) of the first die 110. In other embodiments, the adhesive pattern 150 includes a plurality of dot structures discretely distributed and surrounding the perimeter 110p of the first die 110 and perimeters 120p of the second dies 120 in the top view.

In some embodiments, a layout area of the adhesive pattern 150 is less than that of the whole package 100. For example, a ratio of the layout area of the adhesive pattern 150 to the layout area of the package 100 is about 5% to about 99%.

Figure 3A:
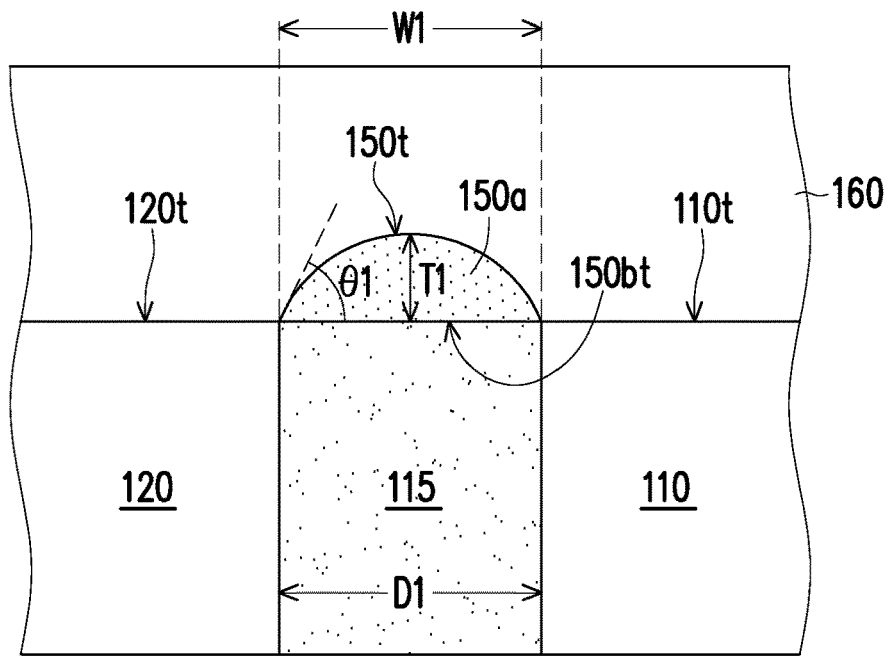
FIG. 3A and FIG. 3B are enlarged views of a portion of the package structure illustrated in FIG. 1C.
Figure 3B:
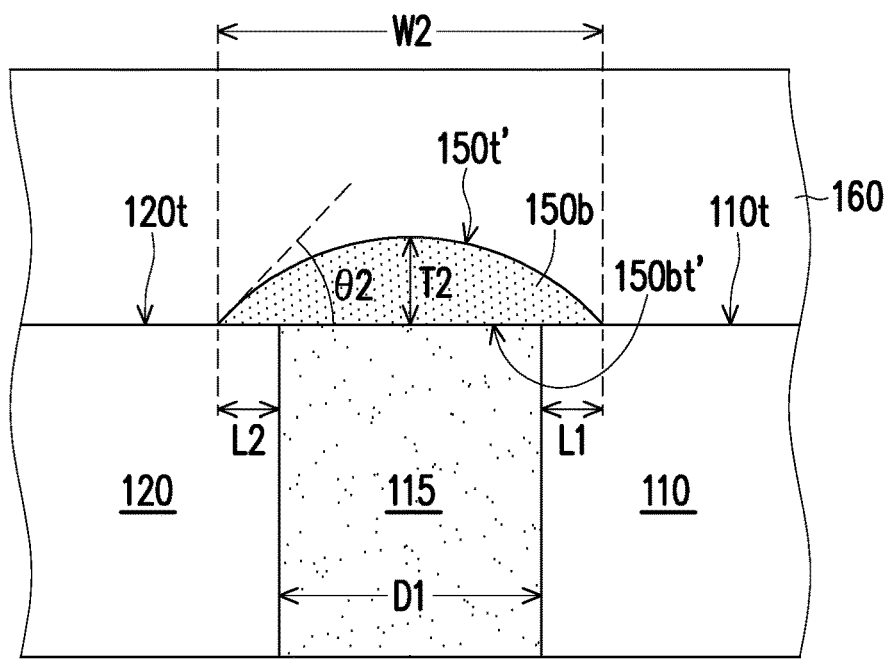

FIG. 3A and FIG. 3B are enlarged views of a portion 150p of the package structure 10 illustrated in FIG. 1C.

Referring to FIG. 3A, an adhesive pattern 150a is formed and restricted on the underfill layer 115 without extending onto the top surfaces 110t, 120t of the first and second dies 110, 120. In detail, the adhesive pattern 150a may have a width W1 substantially equal to or less than a distance D1 between the first die 100 and the adjacent second die 120. In some embodiments, the width W1 is about 10 μm to about 300 μm, such as 100 μm. The distance D1 may be about 10 μm to about 300 μm, such as 100 μm. In addition, the adhesive pattern 150a may have a flat bottom surface 150bt and a curved top surface 150t. In some embodiments, the bottom surface 150bt of the adhesive pattern 150a is substantially aligned with the top surfaces 110t, 120t of the first and second dies 110, 120. The curved top surface 150t of the adhesive pattern 150a may be a convex surface that protrudes along a direction from the bottom surface 150bt to the top surface 150t. An included angle θ1 is between the top surface 150t and the bottom surface 150bt of the adhesive pattern 150a, wherein the included angle θ1 may be an acute angle. In some embodiments, the included angle θ1 is about 5 degree to about 85 degree, such as 45 degree. In addition, a thickness T1 of the adhesive pattern 150a gradually decreases along a direction from center to edge. For example, the highest thickness T1 of the adhesive pattern 150a is about 0.5 μm to 100 μm, such as about 10 μm.

Referring to FIG. 3B, an adhesive pattern 150b not only covers on the underfill layer 115, but also extends to cover a portion of the top surfaces 110t, 120t of the first and second dies 110, 120. In the case, the adhesive pattern 150b further covers and protects interfaces between the underfill layer 115 and the first and second dies 110, 120, thereby avoiding the defects. Specifically, the adhesive pattern 150b may have a width W2 greater than the distance D1 between the first die 100 and the adjacent second die 120. In some embodiments, the width W2 is about 10 μm to about 300 μm, such as 140 μm. In the case, the adhesive pattern 150b may in contact with the portions of the top surfaces 110t, 120t of the first and second dies 110, 120. The adhesive pattern 150b may have an extending length L1 which is measured from an interface between the first die 110 and the underfill layer 115 to a right edge of the adhesive pattern 150b. In addition, the adhesive pattern 150b may have another extending length L2 which is measured from an interface between the second die 120 and the underfill layer 115 to a left edge of the adhesive pattern 150b. In one embodiment, the extending length L1 is the same with the extending length L2. In another embodiment, the extending length L1 is different from the extending length L2. For example, the extending length L1 is about 3 μm to 60 μm, such as about 20 μm. The extending length L2 may be about 3 μm to 60 μm, such as about 20 μm. An included angle θ2 is between the top surface 150t' and the bottom surface 150bt' of the adhesive pattern 150b, wherein the included angle θ2 may be an acute angle. In some embodiments, the included angle θ2 is about 5 degree to about 85 degree, such as 45 degree. In one embodiment, the included angle θ2 is less than the included angle θ1. In other embodiments, the included angle θ2 is greater than or substantial equal to the included angle θ1. In addition, a thickness T2 of the adhesive pattern 150b also gradually decreases along the direction from center to edge. For example, the highest thickness T2 of the adhesive pattern 150b is about 0.5 μm to 100 μm, such as about 10 μm.

Figure 4A:
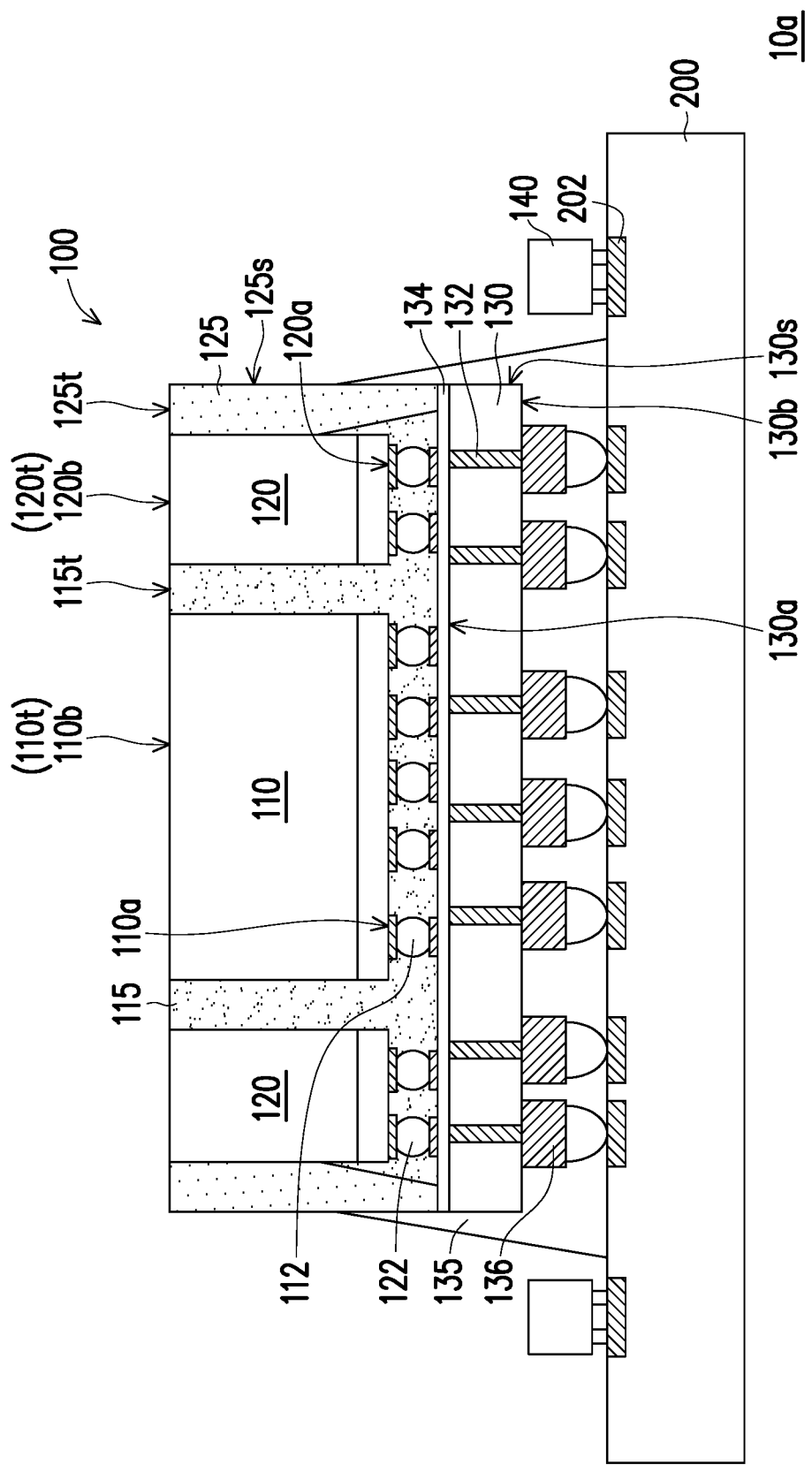
FIG. 4A to FIG. 4C are cross-sectional views of a method of forming a package structure in accordance with a second embodiment.
Figure 4B:
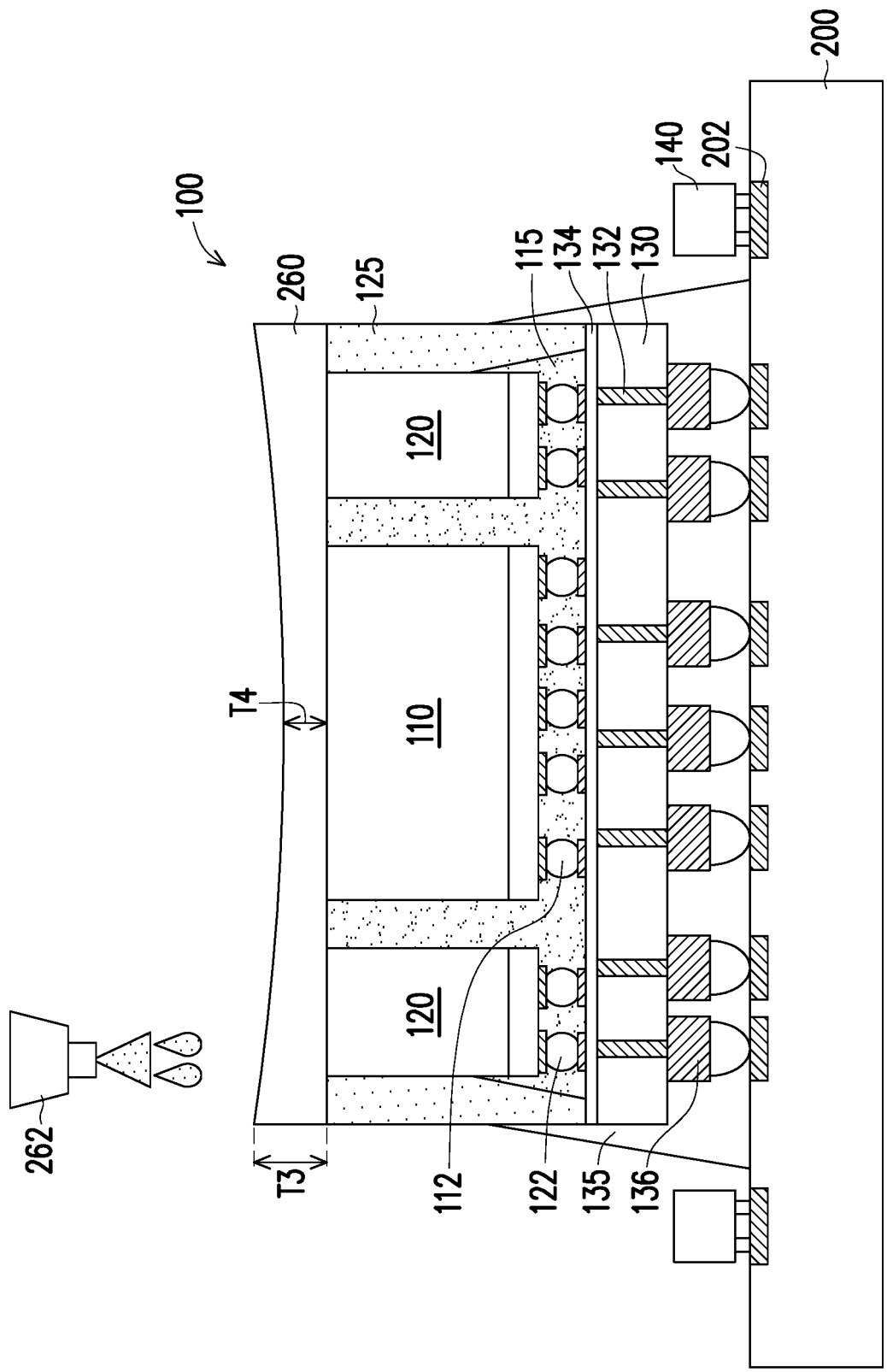
Figure 4C:
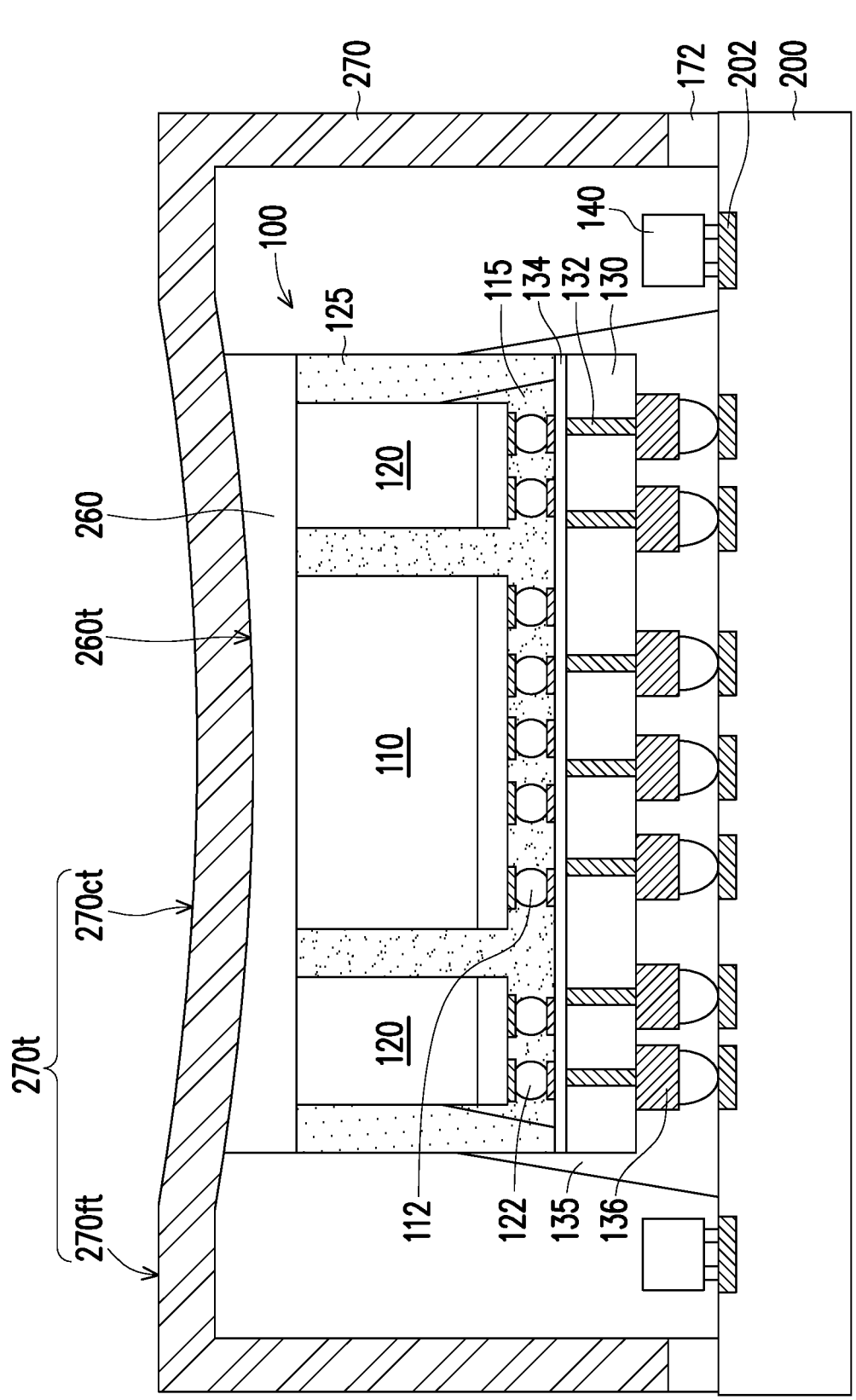

FIG. 4A to FIG. 4C are cross-sectional views of a method of forming a package structure in accordance with a second embodiment.

Referring to FIG. 4A, the CoWoS package 10a is provided. The structures, materials, and functions may be similar to what are shown in, and discussed referring to, FIG. 1A. The details are thus no repeated herein.

Referring to FIG. 4B, a TIM 260 is dispensed on the first die 110, the second dies 120, the underfill layer 115, and the first encapsulant 125 by a dispenser 262. In some embodiments, the TIM 260 includes a material with higher thermal conductivity (k), such as Ag, Cu, Sn, In, carbon nanotube (CNT), graphite, or the like. It should be noted that the TIM 260 has an edge thickness T3 greater than or substantially equal to a center thickness T4 of the TIM 260. The thicker edge thickness T3 may provide a better adhesion between the TIM 260 and the edge encapsulant 125, thereby decreasing the delamination issue and increasing the reliability for high-warpage area. The thinner center thickness T4 may achieve better thermal dissipation, especially from the first die 110 (e.g., SoC or GPU). In some embodiments, the edge thickness T3 is about 5 μm to about 400 μm, such as about 200 μm; the center thickness T4 is about 3 μm to about 300 μm, such as about 100 μm; a ratio (T3/T4) of the edge thickness T3 to the center thickness T4 is about 1.1 to about 5, such as about 2. In the case, the specific range of the edge thickness T3 and/or the center thickness T4 of the TIM 260 may provide a better coverage than the thinner TIM and a better thermal dissipation than the thicker TIM. That is, when the edge thickness T3 is less than 5 μm and the center thickness T4 is less than 3 μm, the TIM 260 may have a bad coverage without completely covering the underlying structure. On the other hand, when the edge thickness T3 is greater than 400 µm and the center thickness T4 is greater than 300 µm, the TIM 260 may have a bad thermal dissipation.

Referring to FIG. 4C, a lid 270 is then attached to the package 100 and circuit substrate 200 to form a package structure 20. As shown in FIG. 4C, the lid 270 covers and surrounds the package 100 and the passive devices 140. Specifically, the lid 270 is adhered to the package 100 by the TIM 260 and adhered to the circuit substrate 200 by an adhesive 172. Since the TIM 260 has the thicker edge thickness T3 and the thinner center thickness T4, the TIM 260 has a concave top surface 260*t*. The concave top surface 260*t* may be recessed along a direction from the first die 110 to the interposer 130. Further, the lid 270 may conformally covers the concave top surface 260*t* of the TIM 260 and has a concave top surface 270*ct* corresponding to the concave top surface 260*t* of the TIM 260. As shown in FIG. 4C, the lid 270 has a top surface 270*t* including a flat top surface 270*ft* and the concave top surface 270*ct*. The concave top surface 270*ct* is surrounded by the flat top surface 270*ft*. The flat top surface 270*ft* is higher than the concave top surface 270*ct*. The arrangement and material of the TIM 260 and the lid 270 are similar to the arrangement and material of the TIM 160 and the lid 170 and has been described in detail in the above embodiments. Thus, details thereof are omitted here.

FIG. 5A to FIG. 5D are cross-sectional views of a method of forming a package structure in accordance with a third embodiment.

Figure 5A:
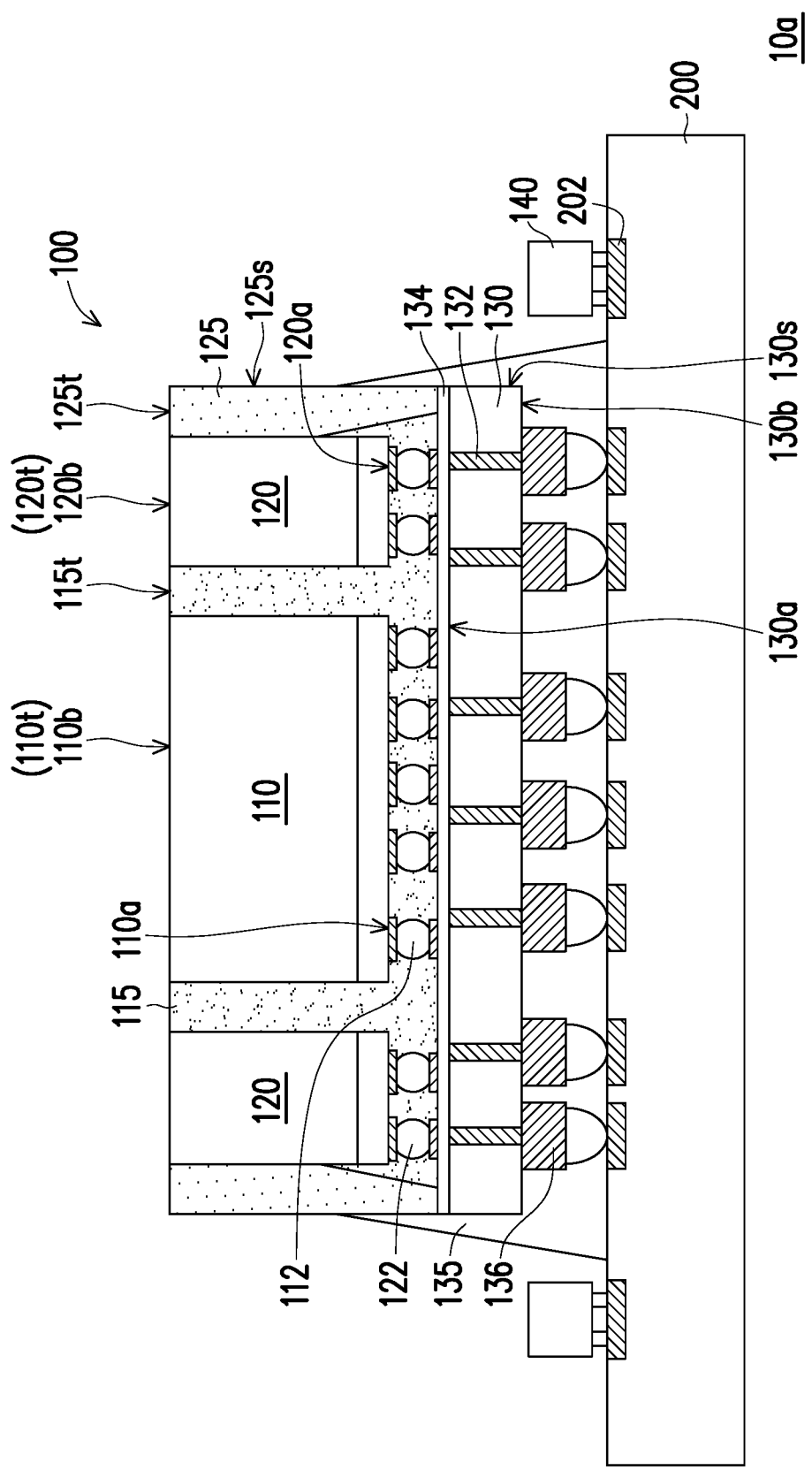
FIG. 5A to FIG. 5D are cross-sectional views of a method of forming a package structure in accordance with a third embodiment.

Referring to FIG. 5A, the CoWoS package 10*a* is provided. The structures, materials, and functions may be similar to what are shown in, and discussed referring to, FIG. 1A. The details are thus no repeated herein.

Figure 5B:
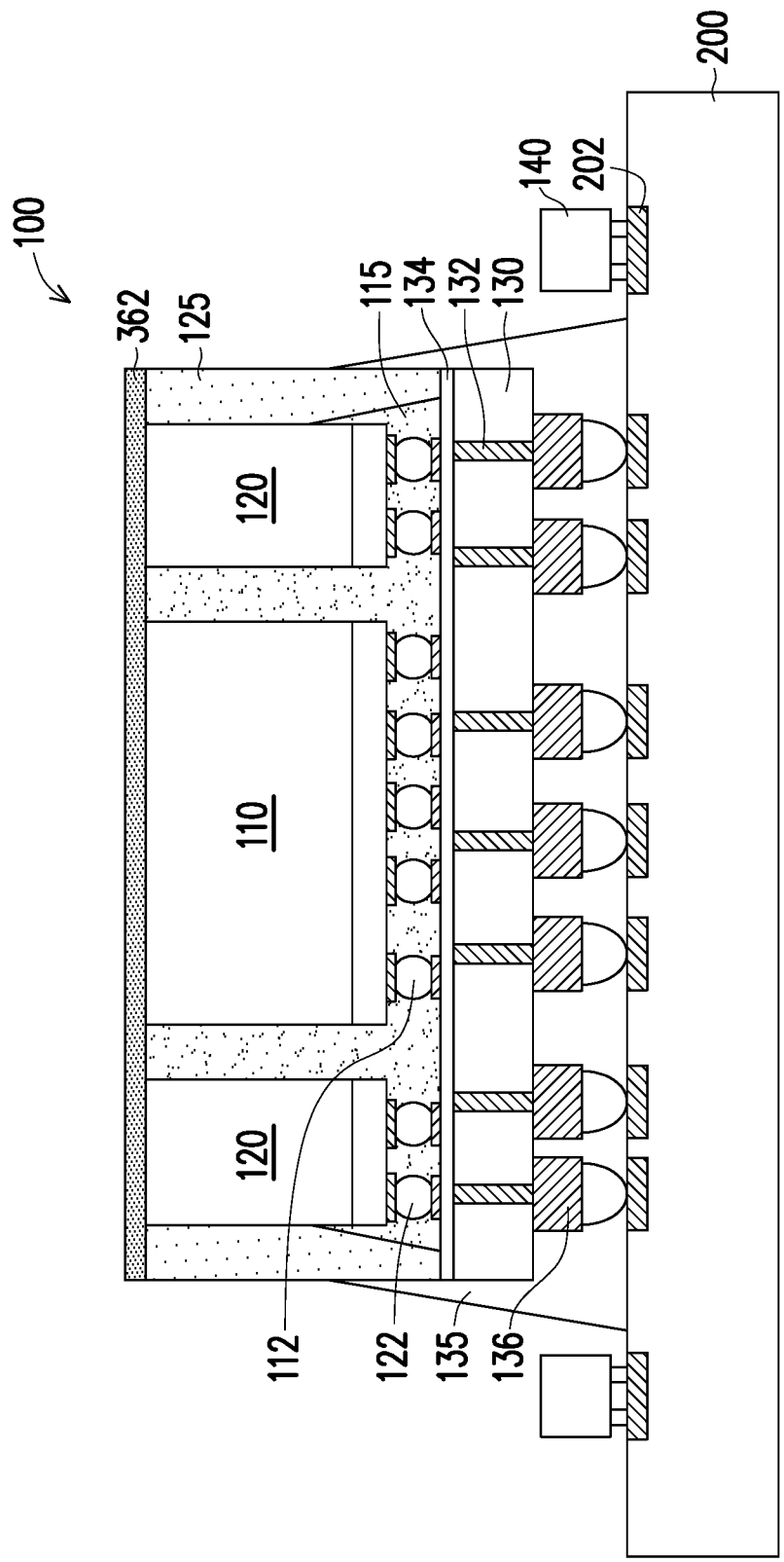

Referring to FIG. 5B, a first metal layer 362 is formed on the package 100. The first metal layer 362 may be formed on the package 100 before or after the package 100 is singulated. The first metal layer 362 may be formed from a conductive material or metal, such as Ag, Au, Ti, NiV, Al, TiN, Cu, Sn, the like, or a combination thereof. The first metal layer 362 may be formed by depositing a seed layer over the interposer 130 (e.g., on the first encapsulant 125, the first and second dies 110, 120, and the underfill layer 115), and then electroplating the conductive material onto the seed layer. The first metal layer 362 may also be formed by sputtering the conductive material onto the package 100. In some embodiments, the first metal layer 362 is a continuous structure that blanketly covers the first encapsulant 125, the first and second dies 110, 120, and the underfill layer 115. In some embodiments, the first metal layer 362 is electrically floating. That is, the first metal layer 362 may be electrically insulated from the active and/or passive devices of the first and second dies 110, 120 and other surrounding devices.

Figure 5C:
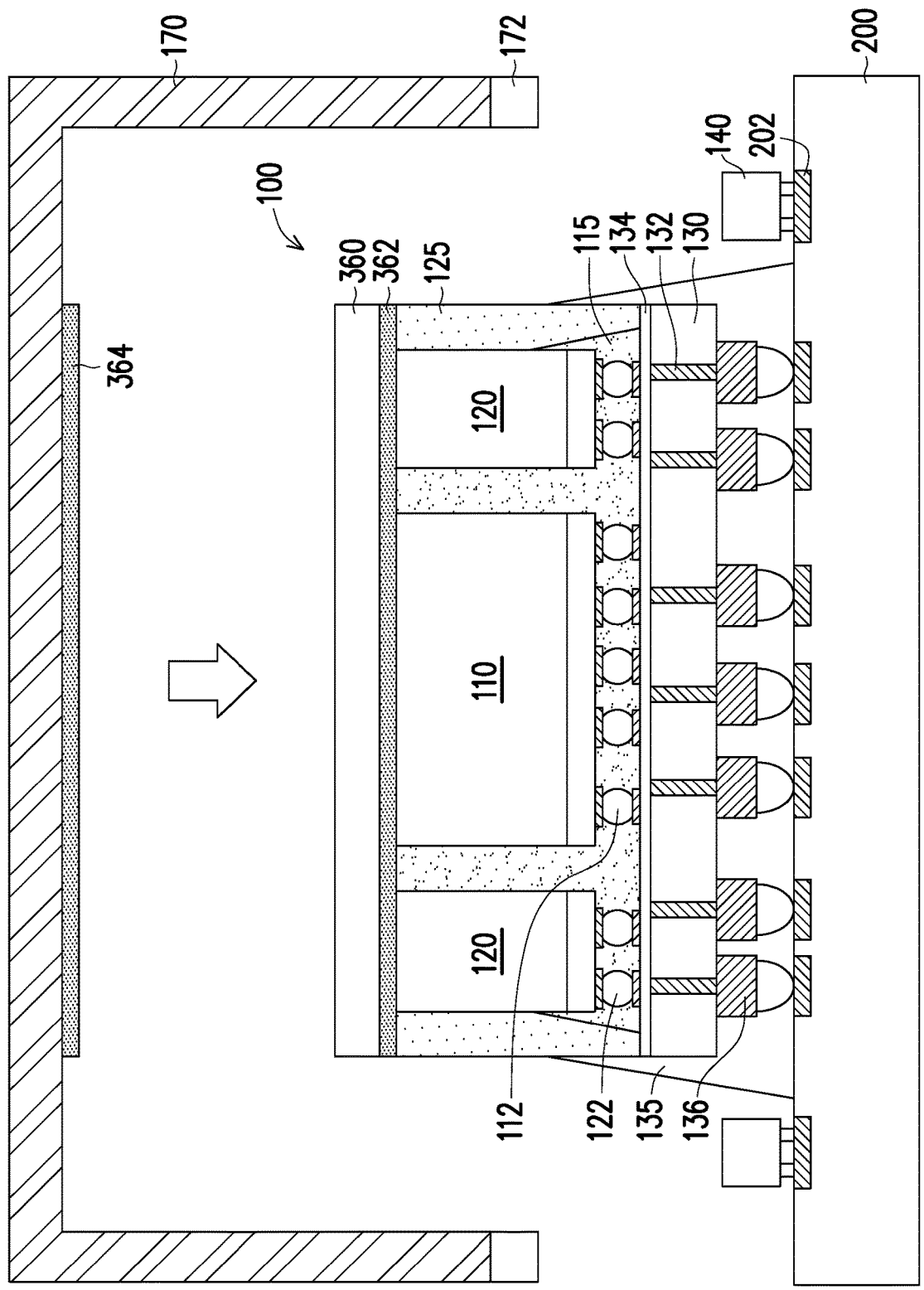
Figure 5D:
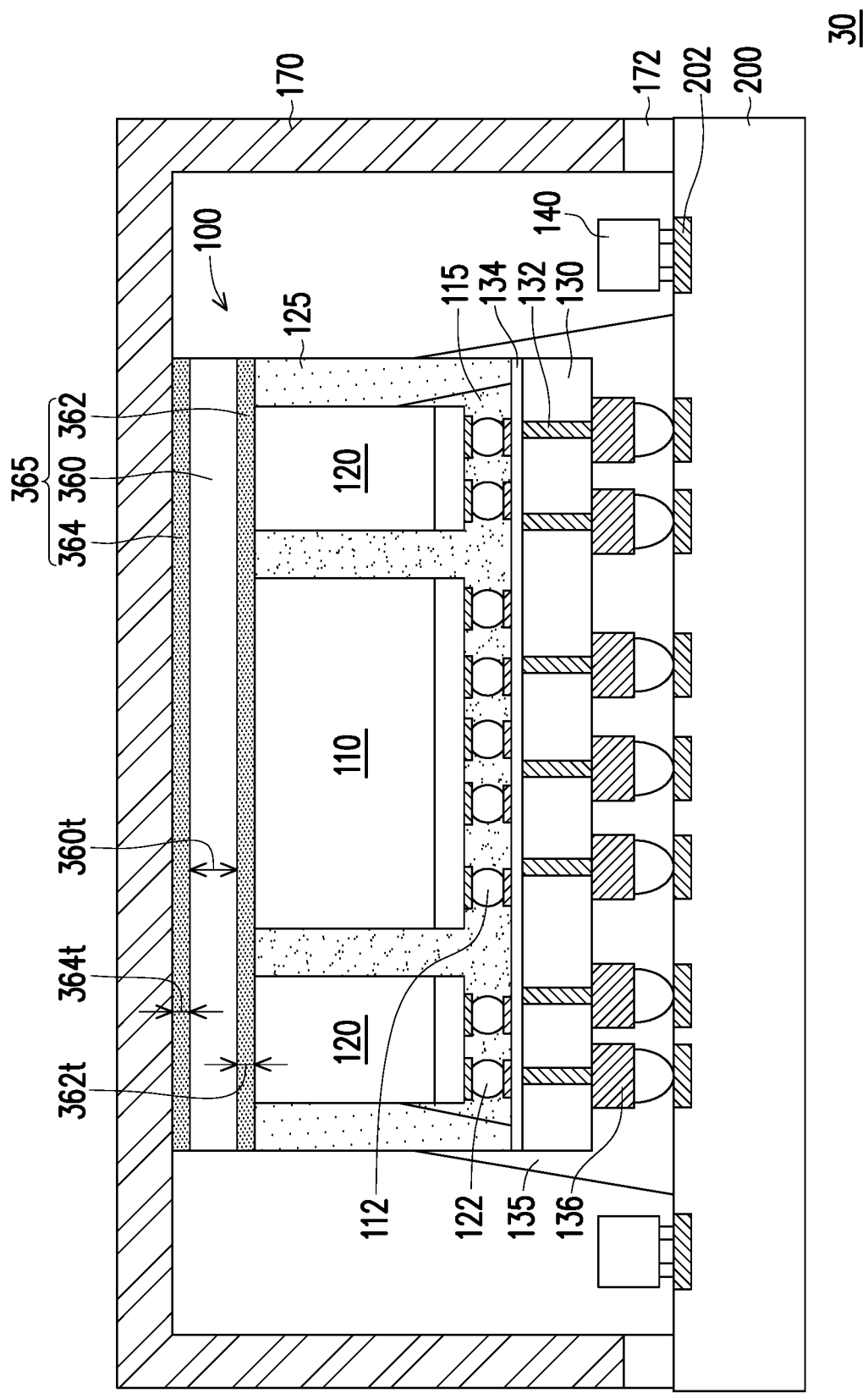

Referring to FIG. 5C and FIG. 5D, a TIM 360 is then dispensed on the first metal layer 362. The material of the TIM 360 is similar to the material of the TIM 160 and has been described in detail in the above embodiments. Thus, details thereof are omitted here. The lid 170 coated with a second metal layer 364 is then attached to the package 100 and the circuit substrate 200 to form a package structure 30. In the case, as shown in FIG. 5D, the first metal layer 362, the second metal layer 364, and the TIM 360 sandwiched between the first and second metal layers 362, 364 constitutes a composite structure 365 to thermally couple the lid 170 and the first and second dies 110, 120. The second metal layer 364 may be formed from a conductive material or metal, such as Ag, Au, Ti, NiV, Al, TiN, Cu, Sn, the like, or a combination thereof. The second metal layer 364 may be formed by depositing a seed layer and then electroplating the conductive material onto the seed layer. The second metal layer 364 may also be formed by sputtering the conductive material onto an inner surface of the lid 170. In some embodiments, the second metal layer 364 is a continuous structure that covers the TIM 360. In some embodiments, the second metal layer 364 is electrically floating. That is, the second metal layer 364 may be electrically isolated from the active and/or passive devices of the first and second dies 110, 120 and other surrounding devices. Alternatively, the second metal layer 364 may be omitted and the TIM 360 is in contact with the lid 170.

In some embodiments, the first metal layer 362 and the second metal layer 364 have the same material or different materials. In some embodiments, the first metal layer 362 has a thickness 362*t* substantially equal to a thickness 364*t* of the second metal layer 364. The thickness 362*t* of the first metal layer 362 may be about 0.1 µm to about 10 µm, such as about 1 µm. The thickness 364*t* of the second metal layer 364 may be about 0.1 µm to about 10 µm, such as about 1 µm. In the case, the specific range of the thickness 362*t* and/or the thickness 364*t* may provide a better coverage than the thinner metal layer and a better thermal dissipation than the thicker metal layer. That is, when the thickness 362*t* and/or the thickness 364*t* is less than 0.1 µm, the first metal layer 362 and/or the second metal layer 364 may have a bad coverage without completely covering the underlying structure. On the other hand, when the thickness 362*t* and/or the thickness 364*t* is greater than 10 µm, the first metal layer 362 and/or the second metal layer 364 may have a bad thermal dissipation. In some alternative embodiments, the thickness 362*t* of the first metal layer 362 is less than or greater than the thickness 364*t* of the second metal layer 364. In some embodiments, the TIM 360 has a thickness 360*t* greater than or substantially equal to the thickness 362*t* of the first metal layer 362 and/or the thickness 364*t* of the second metal layer 364. The thickness 360*t* of the TIM 360 may be about 3 µm to about 300 µm, such as about 60 µm.

It should be noted that the first metal layer 362 may improve an adhesion between the TIM 360 and the package 100 (especially the underfill layer 115 and the first encapsulant 125), thereby decreasing the delamination issue and increasing the reliability. In other words, the first metal layer 362 may be referred to as an adhesive film, layer, or pattern. Similarly, the second metal layer 364 may improve an adhesion between the TIM 360 and the lid 170, thereby decreasing the delamination issue and increasing the reliability. The second metal layer 364 may also be referred to as an adhesive film, layer, or pattern. Further, the composite structure 365 including the TIM 360 sandwiched between the first metal layer 362 and the second metal layer 364 may have a high thermal conductivity and may conform to the shape of the package 100, including conforming to any warpage that may have been introduced in the package 100. As such, the overall thermal resistance of the package structure 30 may be reduced.

Figure 6:
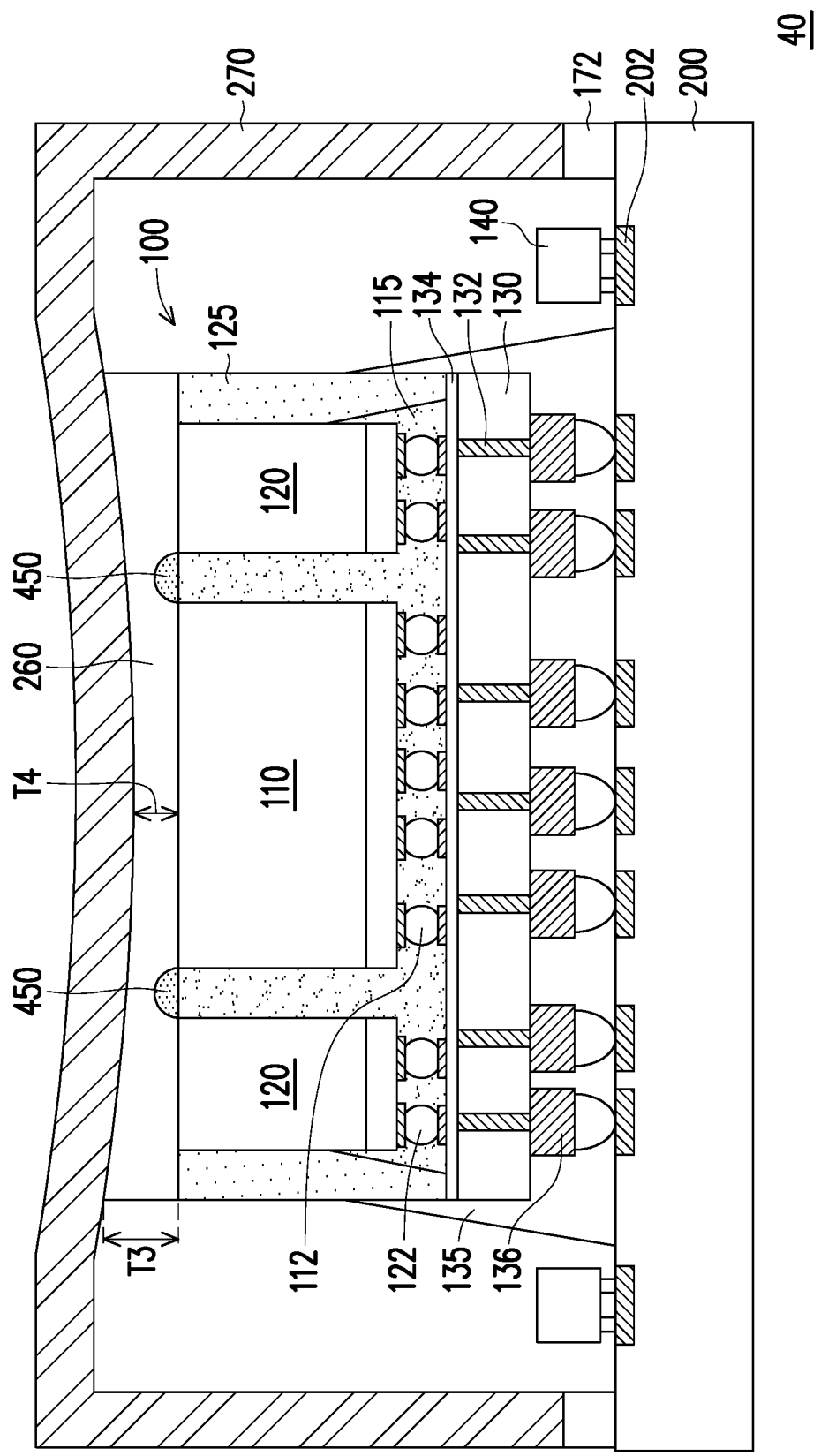
FIG. 6 is a cross-sectional view of a package structure in accordance with a fourth embodiment.

FIG. 6 illustrates a package structure 40 having an adhesive pattern 450 and the TIM 260. Specifically, the adhesive pattern 450 is dispensed on the underfill layer 115. The TIM 260 with different thickness is then dispensed on the adhesive pattern 450, the first encapsulant 125, and the first and second dies 110 and 120, so that the adhesive pattern 450 is surrounded by the TIM 260. The material of the adhesive pattern 450 is similar to the material of the adhesive pattern 150 and has been described in detail in the above embodiments. Thus, details thereof are omitted here. In the case, the package structure 40 may have advantages combined from the package structures 10 and 20. That is, the adhesive pattern 450 may improve the adhesion between the TIM 260 and the underfill layer 115. The thicker edge thickness T3 may improve the adhesion between the TIM 260 and the edge encapsulant 125, thereby decreasing the delamination issue and increasing the reliability for high-warpage area. The thinner center thickness T4 may achieve better thermal dissipation, especially from the first die 110 (e.g., SoC or GPU). In some embodiments, the adhesive pattern 450 is formed and restricted on the underfill layer 115. In some other embodiments, the adhesive pattern 450 extends to cover portions of the first and second dies 110, 120. In some embodiments, a layout area of the adhesive pattern 450 is less than that of the adhesive pattern 150 illustrated in FIG. 2. For example, a ratio of the layout area of the adhesive pattern 450 to the layout area of the package 100 is about 5% to about 99%. Alternatively, the adhesive pattern 450 may be optionally formed on the first encapsulant 125 to separate the first encapsulant 125 from the TIM 260.

According to some embodiments, a package structure includes a first die, a second die group, an interposer, an underfill layer, a thermal interface material (TIM), and an adhesive pattern. The first die and the second die group are disposed side by side on the interposer. The underfill layer is disposed between the first die and the second die group. The TIM is disposed on the first die, the second die group, and the underfill layer. The adhesive pattern is disposed between the underfill layer and the TIM to separate the underfill layer from the TIM.

According to some embodiments, a package structure includes a first die, a second die, an interposer, an underfill layer, a thermal interface material (TIM), and a first metal layer. The first die and the second die are disposed side by side on the interposer. The TIM is disposed on the first die, the second die, and the underfill layer. The TIM has an edge thickness greater than a center thickness of the TIM.

According to some embodiments, a method of forming a package structure includes: bonding a first die and a second die onto an interposer; dispensing an underfill layer between the first die and the second die; forming a first encapsulant to laterally encapsulate the first die, the second die, and the underfill layer; forming an adhesive pattern on the underfill layer between the first die and the second die and on the first encapsulant; and dispensing a thermal interface material (TIM) on the adhesive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
 a first die and a second die group, disposed side by side on an interposer;
 an underfill layer, disposed between the first die and the second die group;
 a thermal interface material (TIM), disposed on the first die, the second die group, and the underfill layer;
 an adhesive pattern, disposed between the underfill layer and the TIM to separate the underfill layer from the TIM; and
 an encapsulant laterally encapsulating the first die, the second die group, and the underfill layer, wherein a sidewall of the encapsulant is substantially aligned with a sidewall of the interposer.

2. The package structure of claim 1, wherein the second die group comprises at least one second die or a plurality of second dies, the plurality of second dies are respectively disposed at both sides of the first die, and the adhesive pattern comprises a plurality of adhesive layers discretely distributed on the underfill layer between the first die and the plurality of second dies.

3. The package structure of claim 2, wherein a portion of the plurality of adhesive layers is disposed between the encapsulant and the TIM to separate the encapsulant from the TIM.

4. The package structure of claim 2, wherein one of the plurality of adhesive layers has a curved top surface and has a thickness decreasing along a direction from center to edge.

5. The package structure of claim 1, wherein the adhesive pattern extends from a top surface of the underfill layer to cover a portion of a top surface of the first die and a portion of a top surface of the second die group.

6. The package structure of claim 1, wherein a first interface is formed between the adhesive pattern and the TIM, and a second interface is formed between the adhesive pattern and the underfill layer.

7. The package structure of claim 1, wherein the TIM has a plurality of fillers, and the adhesive pattern is free of fillers.

8. The package structure of claim 1, wherein the adhesive pattern comprises a first metal layer extending to cover the first die and the second die group.

9. The package structure of claim 8, further comprising:
 a circuit substrate, bonded to the interposer;
 a lid, adhered to the circuit substrate, the first die, and the second die group, the lid covering and surrounding the first die and the second die group; and
 a second metal layer, disposed between the TIM and the lid, wherein a composite structure including the TIM, the first metal layer, and the second metal layer thermally couples the lid and the first die and the second die group.

10. The package structure of claim 9, wherein the first metal layer and the second metal layer are both electrically floating.

11. The package structure of claim 1, wherein the TIM has an edge thickness greater than a center thickness of the TIM.

12. The package structure of claim 1, wherein the TIM has a thermal conductivity greater than a thermal conductivity of the adhesive pattern.

13. A package structure, comprising:
 a first die and a second die, disposed side by side on an interposer;
 an underfill layer, disposed between the first die and the second die;
 a thermal interface material (TIM), disposed on the first die, the second die, and the underfill layer, wherein the TIM has an edge thickness greater than a center thickness of the TIM; and
 a lid, adhered to the TIM, wherein the TIM has a first concave top surface, the lid conformally covers the first concave top surface of the TIM, and the lid has a second concave top surface corresponding to the first concave top surface.

14. The package structure of claim 13, further comprising:
a circuit substrate, bonded to the interposer;
a passive device, bonded to the circuit substrate; and
the lid, further adhered to the circuit substrate, the lid covering and surrounding the passive device, the first die, and the second die.

15. A method of forming a package structure, comprising:
bonding a first die and a second die onto an interposer;
dispensing an underfill layer between the first die and the second die;
forming a first encapsulant to laterally encapsulate the first die, the second die, and the underfill layer;
forming an adhesive pattern on the underfill layer between the first die and the second die and on the first encapsulant; and
dispensing a thermal interface material (TIM) on the adhesive pattern, wherein a sidewall of the first encapsulant is substantially aligned with a sidewall of the interposer.

16. The method of claim 15, wherein the forming the adhesive pattern comprises: forming a first metal layer extending to cover the first die and the second die.

17. The method of claim 16, further comprising:
forming a second metal layer on the TIM, so that the first metal layer, the TIM, and the second metal layer form as a composite structure;
bonding the interposer onto a circuit substrate; and
adhering a lid onto the circuit substrate and the composite structure, wherein the composite structure thermally couples the lid with the first die and the second die.

18. The method of claim 15, wherein the adhesive pattern is formed to have a plurality of adhesive layers laterally spaced from each other in a cross-sectional view.

19. The method of claim 15, further comprising:
bonding the interposer onto a circuit substrate; and
adhering a lid onto the circuit substrate, the first die, and the second die, wherein the lid covers and surrounds the first die and the second die.

20. The method of claim 19, further comprising: forming a second encapsulant on the circuit substrate to laterally encapsulate the first encapsulant and the interposer.

\* \* \* \* \*